US005744974A

United States Patent [19]
Bogden

[11] Patent Number: 5,744,974
[45] Date of Patent: Apr. 28, 1998

[54] TEST HEAD INTERFACE WITH VACUUM-ACTIVATED INTERCONNECTION COMPONENTS

[75] Inventor: W. Scott Bogden, San Martin, Calif.

[73] Assignee: Xilinx, Inc., San Jose, Calif.

[21] Appl. No.: 645,782

[22] Filed: May 14, 1996

Related U.S. Application Data

[63] Continuation of Ser. No. 123,415, Sep. 17, 1993, abandoned.

[51] Int. Cl.$^6$ .................................................. G01R 31/02
[52] U.S. Cl. .......................... 324/758; 324/754; 324/757
[58] Field of Search ........................................ 324/754–764

[56] References Cited

U.S. PATENT DOCUMENTS

| | | | |
|---|---|---|---|
| 4,164,704 | 8/1979 | Keto et al. | 324/758 |
| 4,352,061 | 9/1982 | Matrone | 324/754 |
| 4,357,062 | 11/1982 | Everett | 324/754 |
| 4,527,942 | 7/1985 | Smith | 414/590 |
| 4,588,346 | 5/1986 | Smith | 414/673 |
| 4,589,815 | 5/1986 | Smith | 414/590 |
| 4,625,164 | 11/1986 | Golder et al. | 324/763 |
| 4,636,723 | 1/1987 | Coffin | 324/763 |
| 4,715,574 | 12/1987 | Holt et al. | 248/297 |
| 4,746,861 | 5/1988 | Nesbitt | 324/761 |
| 4,771,234 | 9/1988 | Cook et al. | 324/758 |
| 4,841,231 | 6/1989 | Angelucci | 324/528 |
| 5,148,103 | 9/1992 | Pasiecznik, Jr. | 324/758 |
| 5,150,042 | 9/1992 | Look et al. | 324/758 |
| 5,500,606 | 3/1996 | Holmes | 324/761 |

OTHER PUBLICATIONS inTEST, "The inTest Handbook, A Guide to Test Head Positioning and Interfacing", Revision 4.0, available from inTEST Corporation, Western U.S. Office, Suite A, 1030 E. Duane Avenue, Sunnyvale, CA 94086, Copyright 1992 (month unavailable).

inTEST Brochure, "in2 Test Head Positioner", available from inTEST Corporation, Western U.S. Office, Suite A, 1030 E. Duane Avenue, Sunnyvale, CA 94086 (date not available).

*Primary Examiner*—Ernest F. Karlsen
*Assistant Examiner*—Russell M. Kobert
*Attorney, Agent, or Firm*—Jeanette S. Harms; Patrick T. Bever

[57] ABSTRACT

An interface assembly in the present invention includes a plate for mounting a test head, a plurality of alignment pins for aligning the test head to a device including a plurality of compressible pins, and a plurality of vacuum-activated components for coupling the plate to the device. After the test head is positioned in operative relation to the other device, the vacuum-activated components provide a vacuum which draws the plate and the device together. The interface assembly eliminates the purely mechanical securing of the plate to the device, thereby minimizing any rocking of the test head and ensuring equal compression of the plurality of compressible pins. The interface assembly also ensures safe user operation by providing that any obstacle (such as a user's finger) between the interface assembly and the device prevents creation of a vacuum. Thus, the present invention provides a time-efficient, reliable, safety-conscious means for positioning a test head relative to another device.

4 Claims, 5 Drawing Sheets

TEST HEAD INTERFACE WITH VACUUM-ACTIVATED INTERCONNECTION COMPONENTS

This application is a continuation of application Ser. No. 08/123,415, filed Sep. 17, 1993, now abandoned.

FIELD OF THE INVENTION

1. Background of the Invention

The present invention relates to an integrated circuit test head, and in particular to a test head interface that ensures equal compression of all test pins.

2. Description of the Related Art

Testing systems typically include a docking assembly for aligning a test head to a board on another device such as a handler or prober. Typically, this board includes a plurality of compressible pins which must be accurately positioned in pin openings on the test head. FIG. 1A illustrates a known docking assembly 100 which positions test head 101 in operative relation to device 102. Two stacking blocks 108, bolted to device 102, determine the distance between test head 101 and device 102. Docking assembly 100 includes a cut out plate 103 in which test head 101 is mounted. The guide pins 104 on docking assembly 100 mate with apertures 110 formed in stack blocks 108. Each guide pin 104 has a screw (not shown) in the middle which allows the pin to move in the X and Y directions for minor adjustments in the alignment.

To secure plate 103 to device 102, the user engages the cams 105 on plate 103 with pins 106 which extend horizontally outward from stack blocks 108. As shown more clearly in FIG. 1B, cam 105 includes a notch 112, and a groove 111 which extends 180 degrees around the circumference of cam 105. After cam 105 is engaged with pin 106, the user turns each lever 105A on cams 105 180 degrees, thereby securing plate 103 to device 102.

However, because of this mechanical interface, any looseness or slight tilt of cams 105 results in a rocking phenomena. This rocking is exacerbated by stacking blocks 108 which are too short, i.e. typically about six inches, to stabilize plate 103. The rocking changes the pressure exerted against certain compressible pins 107 on board 109. This varying pressure between pins on the same board causes testing errors and sometimes complete malfunction. Correcting for rocking takes considerable manual effort and time, thereby significantly increasing testing expense.

Therefore, a need arises for a docking assembly which provides accurate alignment of the test head to the board on the other device and at the same time ensures equal compression on all pins on the board.

SUMMARY OF THE INVENTION

In accordance with the present invention, an interface assembly includes a plate for mounting the test head, means for aligning the plate to a device which includes a plurality of compressible pins, and a plurality of vacuum-activated components for coupling the plate to the device. After the plate is positioned in operative relation to the device, a vacuum provided by the vacuum-activated components draws the plate and the device together.

The present invention eliminates the purely mechanical securing of the plate to the device, thereby minimizing the rocking problem found in prior art docking apparatuses and providing equal compression of the plurality of compressible pins on the device. In one embodiment of the present invention, a plurality of stacking blocks further stabilize the head. An interface assembly in the present invention also ensures safety of user operation. Specifically, the vacuum-activated components are either coupled to only one tubing or are coupled to a plurality of tubings which are evacuated from the same supply. In this manner, any obstacle (such as a user's finger) between the interface assembly and the device which prevents a seal from occurring in one vacuum-activated component also prevents a seal in the other vacuum-activated components. Thus, the present invention provides a time-efficient, reliable, safety-conscious means for positioning a test head relative to another device.

DETAILED DESCRIPTION OF THE DRAWINGS

Figure 1A:
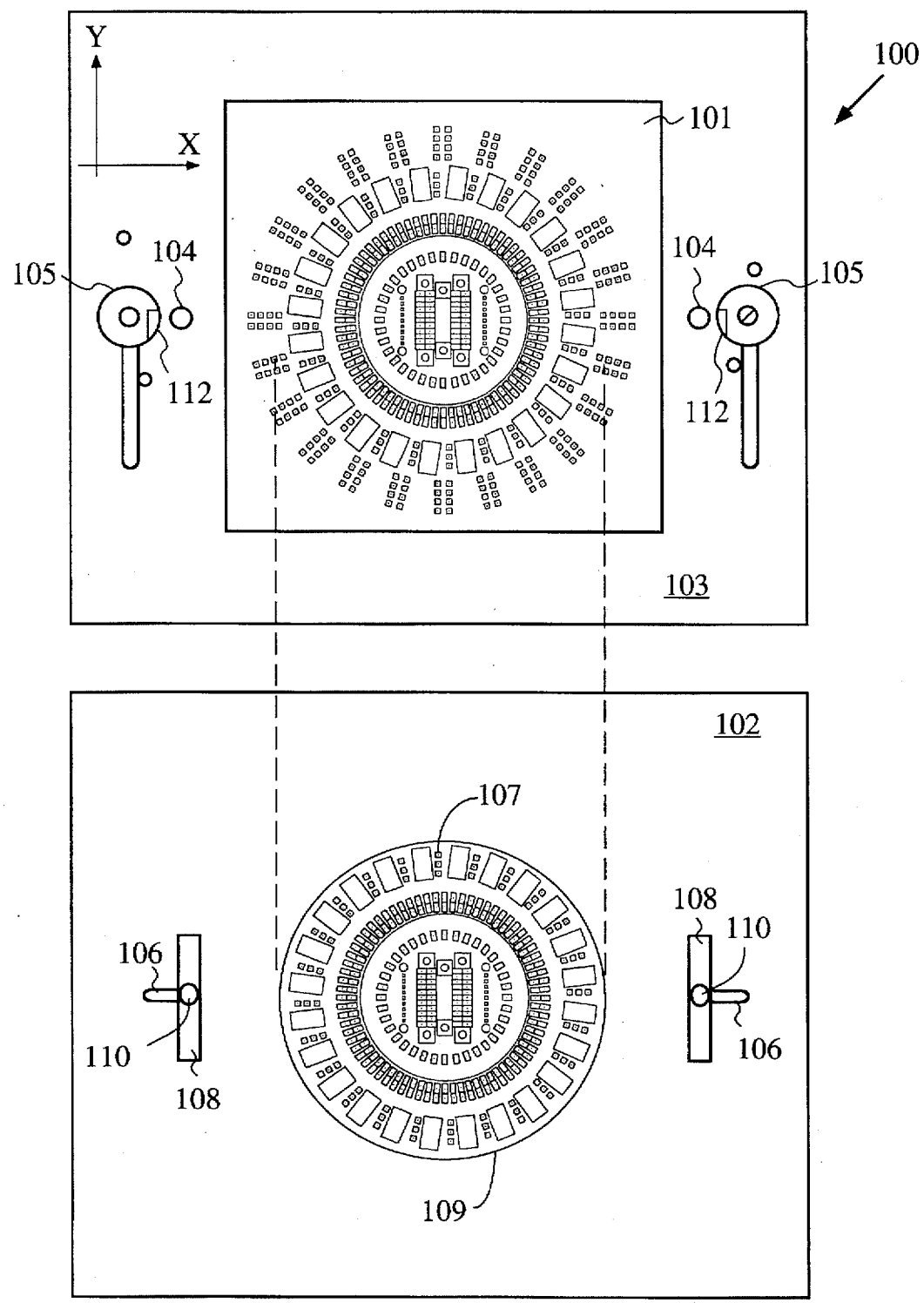
FIG. 1A illustrates a conventional docking assembly which includes two cams.
Figure 2:
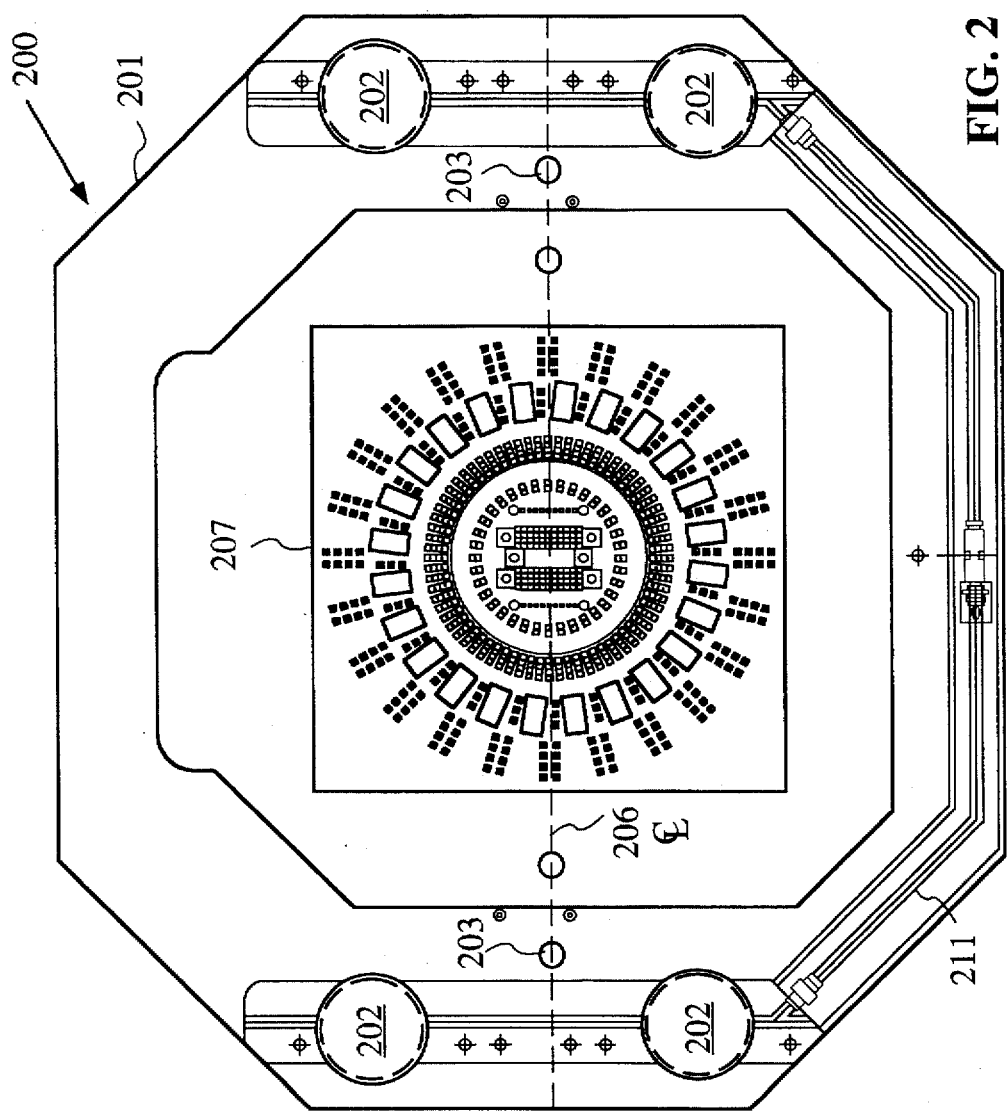
FIG. 2 illustrates a test head interface in accordance with the present invention.

FIG. 2 illustrates a test head interface 200 in accordance with the present invention which includes a plate 201, vacuum cups 202, and guiding pins 203. Test head 207 is mounted on plate 201. Guiding pins 203 are provided on plate 201 and are positioned to mate with apertures 110 (FIG. 1A) on stacking blocks 108. Note that guide pins 203 are positioned on the centerline 206 of test head 207 to ensure proper alignment between test head 207 and board 109 on device 102.

After guiding pins 203 are positioned in apertures 110, a vacuum provided via tubing 211 and vacuum cups 202 draws plate 201 and device 102 together. Stacking blocks 108 determine the distance between plate 201 and device 102, which in turn determines the compression of pins 107 on board 109. However, note that pins 106 of stacking blocks 108 have no functionality in the present invention and are therefore eliminated in other embodiments. Because each cup 202 provides identical vacuum conditions on the surface of device 102, all pins 107 on board 109 are compressed equally. Thus, by replacing the purely mechanical securing apparatus, i.e. cams 105 (FIG. 1) with vacuum-activated components, i.e. vacuum cups 202, which apply equal pressure on plate 201, the present invention minimizes the rocking problem exhibited by docking apparatus 100.

Figure 1B:
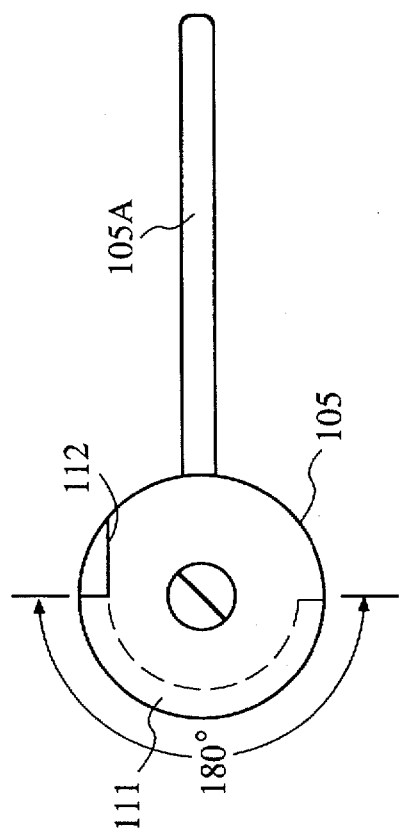
FIG. 1B shows the cam of FIG. 1A.
Figure 3A:
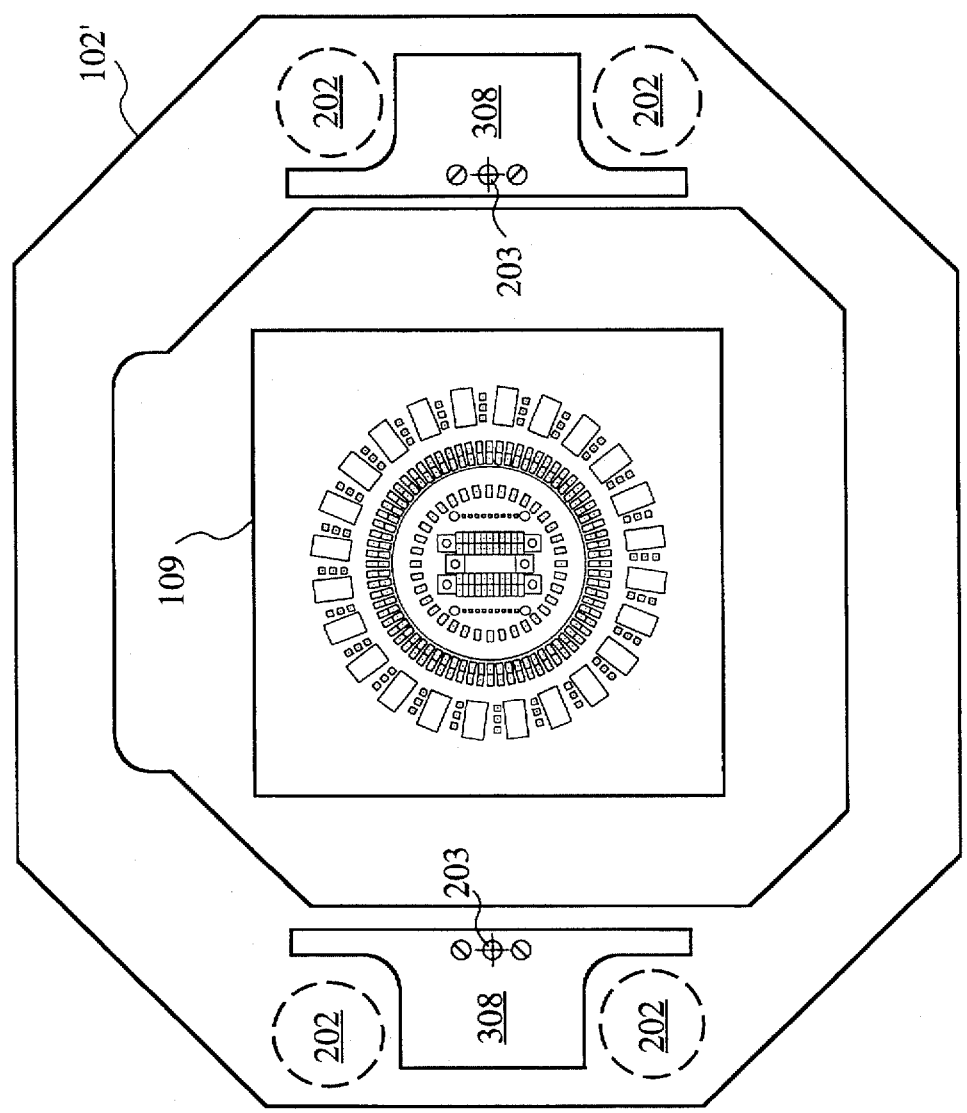
FIG. 3A illustrates two stacking blocks in accordance with one embodiment of the invention positioned in operative relation to the test head interface of FIG. 2.

FIG. 3A shows another embodiment of the present invention in which stacking blocks 308 replace stacking blocks 108 (FIG. 1). Stacking blocks 308 provide more surface area contact for plate 102' than do stacking blocks 108, thereby further stabilizing plate 102'. Note that cams 105 on docking assembly 100 (FIG. 1) severely limit the size of stacking blocks 108. However, because the present invention eliminates cams 105, stacking blocks 308 in this embodiment are fabricated wider and longer than stacking blocks 108, thereby providing significantly more stabilization than prior art docking assembly 100.

Figure 3B:
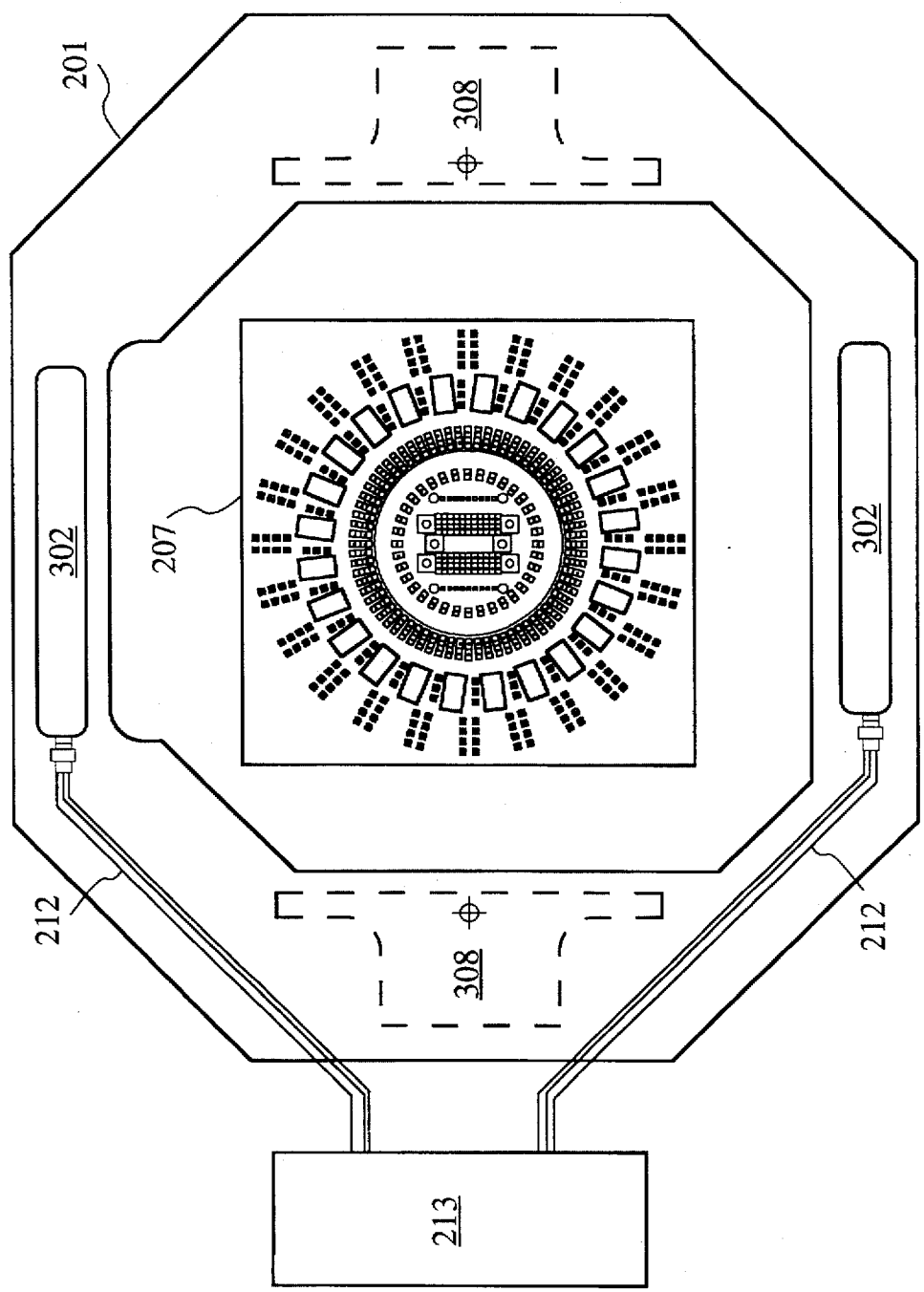
FIG. 3B shows the stacking blocks of FIG. 3A in operative relation to another test head interface in accordance with the present invention.

FIG. 3B illustrates another embodiment of the present invention in which two oval-shaped, vacuum cups 302 replace the four circular vacuum cups 202 (FIGS. 2 and 3A).

Vacuum cups 302 operate identically to vacuum cups 202 and therefore are not explained in detail herein. In accordance with the present invention, the number and shape of the vacuum cups varies depending on the size of plate 201, the size of test head 207, or even the availability of specific vacuum cups.

Furthermore, an interface assembly in the present invention also ensures safe user operation. Specifically, in one embodiment, vacuum cups 202 (FIG. 2) are coupled to only one tubing, i.e. tubing 211. In this manner, any obstacle (such as a user's finger) between plate 201 and device 102 which prevents one of the four cups 202 from sealing, effectively prevents all vacuum cups from sealing. In other embodiments, such as the embodiment shown in FIG. 3B, more than one piece of tubing 212 may lead to vacuum cups 302. However, in these embodiments, all pieces of tubing are evacuated from the same supply 213. In this manner, any obstacle to sealing of one cup 302 also prevents sealing of the other cup 302. Thus, the present invention provides a time-efficient, reliable safety-conscious means for positioning a test head relative to another device.

In one embodiment of the present invention, the plate and the guiding pins are fabricated from aluminum, thereby providing an extremely low cost test head interface. In other embodiments, the plate and the guiding pins are fabricated from other materials, such as stainless steel. Typically, the vacuum cups in accordance with the present invention are fabricated from any conductive or static dissapative material and are rated to withstand a pressure differential of 14–28 inches of mercury. In the embodiment shown in FIG. 2, vacuum cups 202 are standard vacuum cups, such as Model B75 manufactured by Piab having a place of business at 65 Sharp St., Hingham, Mass. 02043. Vacuum is supplied in any conventional manner, including for example, an in-house vacuum system, an electric portable vacuum pump, or a pneumatic vacuum system. In accordance with the present invention, the tubing is fabricated from any vacuum rated material. Note that the plate and the test head are physically positioned relative to the device using any conventional standard test head positioner, such as the in2 Test Head Positioner manufactured by inTEST having a place of business at Suite A, 1030 E. Duane Ave., Sunnyvale, Calif. 94086.

The embodiments described above are meant to be illustrative only and not limiting. Other embodiments of the present invention will be apparent to those skilled in the art. For example, in another embodiment, the vacuum cups are located on the handler or wafer probe instead of on the test head plate. The present invention is set forth in the appended claims.

I claim:

1. A structure for facilitating electrical contact between a test head and a handler, said handler including a plurality of compressible pins extending from the handler toward the test head, said structure comprising:

a test head plate for placement on said test head, said test head plate including a plurality of vacuum-activated components and a plurality of alignment pins; and a handler plate for placement on said handler, said handler plate including a surface for achieving a vacuum with said vacuum-activated components and a plurality of stacking blocks for receiving said plurality of alignment pins, wherein said vacuum-activated components amply identical vacuum conditions on said surface of said handler plate such that said plurality of compressible pins are compressed equally.

2. The structure of claim 1 wherein said stacking blocks provide a predetermined electrical interface between said test head and said handler.

3. The structure of claim 2 wherein said vacuum-activated components include a plurality of cups.

4. An interface for providing a predetermined electrical contact between a test head and a handler, said handler including a plurality of compressible pins extending from the handler toward the test head, said interface comprising:

a first plate for placement on said test head, said first plate including a plurality of vacuum-activated components and means for aligning; and a second plate for placement on said handler, said second plate including a surface for achieving a vacuum with said vacuum-activated components and a plurality of stacking blocks for receiving said means for aligning, wherein said vacuum-activated components apply identical vacuum conditions on said surface of said handler plate such that said plurality of compressible pins are compressed equally.

* * * * *

UNITED STATES PATENT AND TRADEMARK OFFICE
CERTIFICATE OF CORRECTION

PATENT NO. : 5,744,974
DATED : April 28, 1998
INVENTOR(S) : W. Scott Bogden

It is certified that error appears in the above-identified patent and that said Letters Patent is hereby corrected as shown below:

Col. 4, line 20
  replace "amply"
  with --apply--.

Signed and Sealed this

Tenth Day of October, 2000

Attest:

Attesting Officer

Q. TODD DICKINSON
Director of Patents and Trademarks